United States Patent
Dellinger et al.

(10) Patent No.: US 10,715,149 B1
(45) Date of Patent: Jul. 14, 2020

(54) CONFIGURABLE LOGIC BLOCK (CLB) INTERNAL ROUTING ARCHITECTURE FOR ENHANCED LOCAL ROUTING AND CLOCKING IMPROVEMENTS

(71) Applicant: Xilinx, Inc., San Jose, CA (US)

(72) Inventors: Eric F. Dellinger, Longmont, CO (US);
Jay T. Young, Louisville, CO (US);
Brian C. Gaide, Erie, CO (US);
Chirag Ravishankar, Erie, CO (US);
Davis Moore, Longmont, CO (US);
Steven P. Young, Boulder, CO (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/513,190

(22) Filed: Jul. 16, 2019

(51) Int. Cl.
*H03K 19/17736* (2020.01)
*H03K 19/17724* (2020.01)

(52) U.S. Cl.
CPC ... *H03K 19/17744* (2013.01); *H03K 19/1774* (2013.01); *H03K 19/17724* (2013.01)

(58) Field of Classification Search
CPC ......... H03K 19/17744; H03K 19/1774; H03K 19/17724
USPC .................................................. 326/38–41
See application file for complete search history.

(56) References Cited

U.S. PATENT DOCUMENTS

| | | | |
|---|---|---|---|
| 2013/0135008 A1* | 5/2013 | Zhang | B82Y 10/00 326/41 |
| 2013/0285699 A1* | 10/2013 | McWilliams | H03K 19/173 326/41 |
| 2015/0333756 A1* | 11/2015 | Wang | G06F 1/08 326/41 |
| 2016/0028396 A1* | 1/2016 | Gaillardon | H03K 19/0013 326/38 |

* cited by examiner

*Primary Examiner* — Don P Le
(74) *Attorney, Agent, or Firm* — Patterson + Sheridan, LLP (57) ABSTRACT

A system comprises a pair of configurable logic blocks (CLBs) placed adjacent to each other wherein each of the CLBs includes a plurality of configurable logic elements. A plurality sets of inodes are configured to accept signals to and/or from the CLBs, wherein a first set of inodes is positioned to the left of the adjacent CLBs and a second set of inodes is positioned to the right of the adjacent CLBs. A plurality of bnodes are embedded in the middle of the adjacent CLBs, wherein each bnode is configured to establish a first connection between the bnode and one of the first set of inodes on the left of the CLBs and a second connection between the bnode and one of the second set of inodes on the right of the CLBs. Both the first and second routing connections are localized within the pair of adjacent CLBs.

21 Claims, 8 Drawing Sheets

CONFIGURABLE LOGIC BLOCK (CLB) INTERNAL ROUTING ARCHITECTURE FOR ENHANCED LOCAL ROUTING AND CLOCKING IMPROVEMENTS

TECHNICAL FIELD

The disclosure generally relates to internal routing for configurable logic blocks (CLB)s, and routing architecture implementing the proposed CLB internal routing architecture.

BACKGROUND

Recent advances in Field Programmable Gate Array (FPGA) architectures have led to both reduced size of routing multiplexer (or mux) due to NMOS/CMOS scaling as well as track number reduction in the horizontal direction caused by shrinks in wire size and a need to keep layer counts reasonable. These changes have reduced the connectivity between general routing of interconnect wires and configurable logic block (CLB) input pins. Current approaches to deal with the connectivity issue utilize interconnect node or inode structures used to add connectivity to a single slice of CLB. Here, the inode structures are nodes for interconnect that can also be the interface to the general routing.

As the size of transistors in the CLB continues to scale down, the interconnect wires do not scale down accordingly, resulting in less area available for general routing of the interconnect wires. In the meantime, the CLB size of some FPGA architectures has increased by multiple folds. Consequently, using a lot of interconnect wires across the slices of the CLB is becoming less viable.

SUMMARY

A system comprises a pair of configurable logic blocks (CLBs) placed adjacent to each other wherein each of the adjacent CLBs includes a plurality of configurable logic elements. A plurality sets of inodes are configured to accept signals to and/or from the pair of adjacent CLBs, wherein a first set of the inodes is positioned to the left of the pair of adjacent CLBs and a second set of the inodes is positioned to the right of the pair of adjacent CLBs. A plurality of bnodes are embedded in the middle of the adjacent CLBs, wherein each bnode is configured to establish a first connection between the bnode and one of the first set of inodes on the left of the pair of adjacent CLBs and a second connection between the bnode and one of the second set of inodes on the right of the pair of adjacent CLBs. Both the first and second routing connections are localized within the pair of adjacent CLBs.

It is appreciated that each of the plurality of bnodes and inodes includes one or more multiplexers, wherein at least a set of the plurality of bnodes share multiple inputs to their one or more multiplexers. The plurality of bnodes are configured to route an input from one of the first set of inodes to one of the bnodes among the plurality of bnodes and to route the input from the bnode to reach all of the second set of inodes the input is intended to reach without requiring any direct point-to-point connection between the one of the first set of inodes and the he second set of inodes. In some embodiments, one or more dedicated point-to-point connections between one of the first set of inodes on the left of the CLBs and one of the second set of inodes on the right of the CLBs without utilizing the plurality of bnodes in the middle of the adjacent CLBs for fast connection between the inodes on the two sides of the adjacent CLBs. In some embodiments, the plurality of bnodes are arranged into multiple sets each having four bnodes, wherein two bnodes in each set are configured to connect to the first set of inodes on the left side of the adjacent CLBs and two bnodes in the set are configured to connect to the second set of inodes on the right side of the adjacent CLBs. In some embodiments, the plurality of bnodes are configured to serve as a crossbar between the inputs and/or outputs to the first set of inodes and the second set of inodes on different sides of the adjacent CLBs, respectively.

In some embodiments, the system comprises a configurable logic block (CLB) comprising a plurality of configurable logic elements and a clock spine of interconnect wires configured to provide one or more clock signals to the plurality of configurable logic elements via a plurality of control nodes (cnodes). The plurality of cnodes are connected to the plurality of configurable logic elements and configured to drive control pins of the configurable logic elements with the clock signals from the clock spine. The clock spine and said plurality of cnodes are embedded in the center of the CLB, wherein the plurality of configurable logic elements in the CLB are positioned on the left side and right side of the clock spine and said plurality of cnodes and are all connected to the plurality of cnodes in the center of the CLB.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Examples described herein relate to enhanced internal local routing and clocking improvements for a CLB. Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. For example, various methods according to some examples can include more or fewer operations, and the sequence of operations in various methods according to examples may be different than described herein. In addition, an illustrated example need not have all the aspects or advantages shown. An aspect or an advantage described in conjunction with a particular example is not necessarily limited to that example and can be practiced in any other examples even if not so illustrated or if not so explicitly described.

A bounce is a connection between a pin of one mux and another mux (in this case an inode). If the pin is not used or is driven by the same net as a pin connected to via a bounce wire, then the bounce wire may be used as a bounce routing resource to route to the other inode and to another pin. The bounces are used for input versatility such that routing does not have to maneuver around in general routing to hit a specific input. For the CLB, the bounce exists on the bypass pins. If a routing path can quickly utilize a bounce resource due to connectivity, the bounce resource offers an alternative path that reduces usage of general routing. Fast connects are the same type of wire connections but are specific to output pins on the same block. The fast connects allow for block output pins to drive directly back to the block output pins through the inode structures via point-to-point connections. The purpose of the fast connects is to allow fast point-to-point paths and to reduce use of the general routing from local block output to input pins.

A need has arisen for enhanced internal local routing and clocking improvements for a CLB. A new approach is proposed where a layer of mux is added in the center of the CLB to create a large connectivity pattern within the CLB. The large connectivity pattern within the CLB can be used to route most drivers to load connections/pins within the CLB as well as improving ability to route to any inode on the sides of the CLB. In some embodiments, clock pines and/or muxing structure used to drive flop control pins are also moved to the center of the CLB to reduce horizontal track use for interconnect and to reduce the distance between the clock spine to flop control pin, thereby reducing clock skew and clock power usage.

The proposed approach internalized as many connections as possible to localize routing within the CLB, thereby reducing general routing needs as the resources for general routing has been continuously reduced in the latest generation of FPGA architecture. Under the proposed approach, fast connects and bounces become scalable for large CLB and connectivity to inputs/inodes of the CLB is greatly improved. The proposed approach also makes the paths through the CLB faster under the worst-case scenarios.

Figure 1:
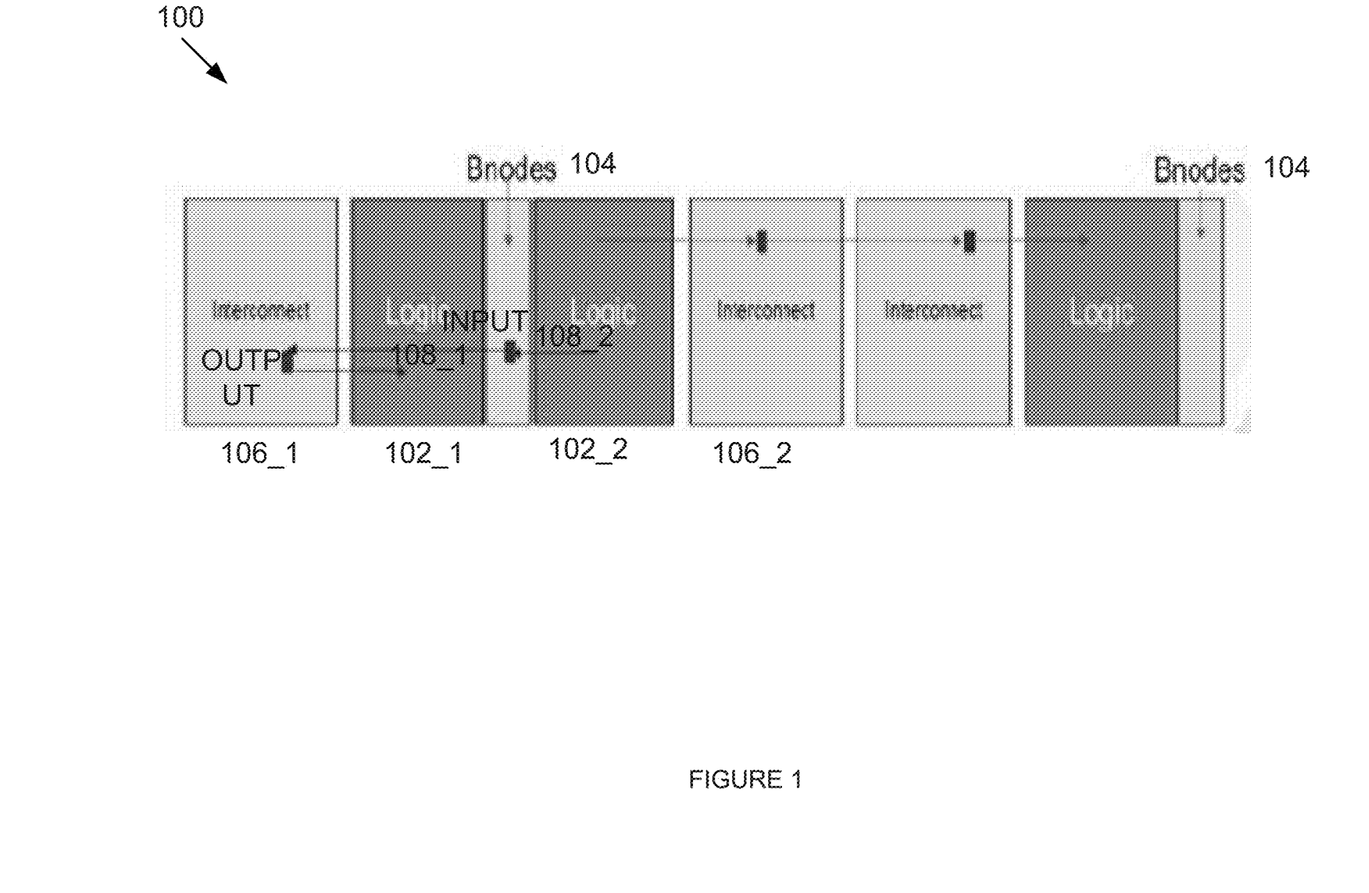
FIG. 1 depicts an example of a CLB internal routing architecture for enhanced local routing for configurable logic blocks (CLBs) in an FPGA architecture, according to some examples.

FIG. 1 depicts an example of a CLB internal routing architecture 100 for enhanced local routing for configurable logic blocks (CLBs) in an FPGA architecture. In the example depicted in FIG. 1, a set of, e.g., 64, bounce nodes (or bnodes) 104s are muxes embedded in the center of/between two adjacent CLBs 102_1 and 102_2 for routing versatility within the CLBs on an extra/lower layer of depth for routing. The bnodes 104s are configured to connect to at least two sets of interconnect/input elements/muxes/nodes or inodes 106_1 and 106_2 positioned on the left and the right of the CLBs 102_1 and 102_2, respectively, e.g., from input to the output of the same CLB 102, to avoid long general interconnect routing across the CLBs 102s by offloading congestion to localized and cheaper metal wires within the same CLBs 102s. Specifically, each bnode 104 is configured to establish a first routing connection 108_1 between the bonde 104 and one of the inodes 106_1 on the left of the CLBs 102s as well as a second routing connection 108_2 between the bonde 104 and one of the inodes 106_2 on the right of the CLBs 102s, wherein both the first and the second routing connections are localized within the adjacent CLBs 102s. As such, instead of having a relatively few fixed paths from outputs to inputs across the CLBs 102 as fast connections, the CLB internal routing architecture 100 enables reliable shorter distance local routes between any outputs and inputs of the adjacent CLBs 104s without using or competing for limited global routing resources.

Figure 2:
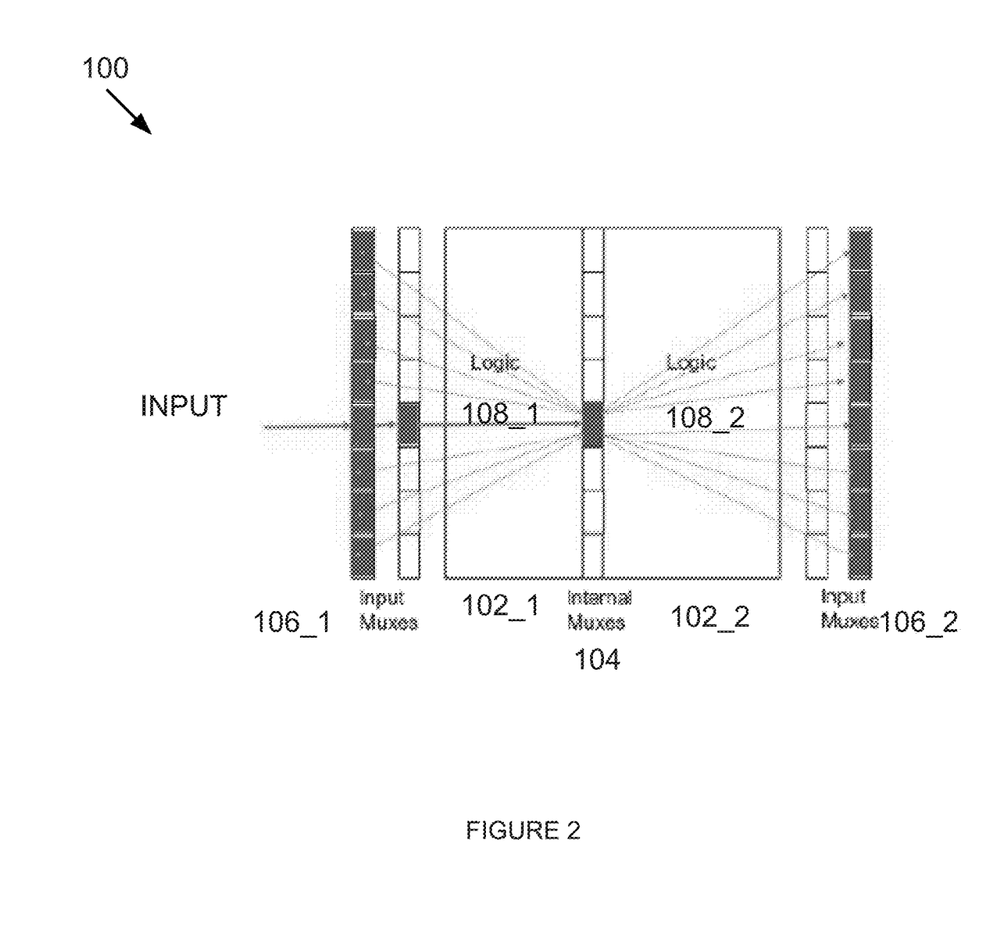
FIG. 2 depicts an example of the CLB internal routing architecture where an input from one of the input muxes/inodes is routed to one of the internal bnodes first, wherein the bnode routes the input to reach all other input muxes/inodes, according to some examples.

In some embodiments, the bnodes 104s are driven by one or more of local outputs, horizontal routing resources, bypass pins, and inodes of the CLBs 102s. Because both horizontal routing resources and bypass pins can drive the bnodes 104s, it is possible to utilize more inode inputs for these connections as alternative routing paths become available. In some embodiments, the bnodes 104s are configured to enable inputs into the internal bnodes 104s to reach all input muxes of the inodes 106s. FIG. 2 depicts an example of the CLB internal routing architecture 100 where an input from one of the inodes 106_1 is routed to one of the internal bnodes 104 first, wherein the bnode 104 is then configured to route the input into the bnode 104 to reach all input muxes/inodes 106_2 the input is intended to reach. As such, the CLB internal routing architecture 100 enables one of the input mux 106_1 on the left of the CLBs 102s to reach to all inodes 106_2 on the right of the CLBs 102 without requiring or consuming many point-to-point global routing resources between the input muxes/inodes 106s.

Figure 3:
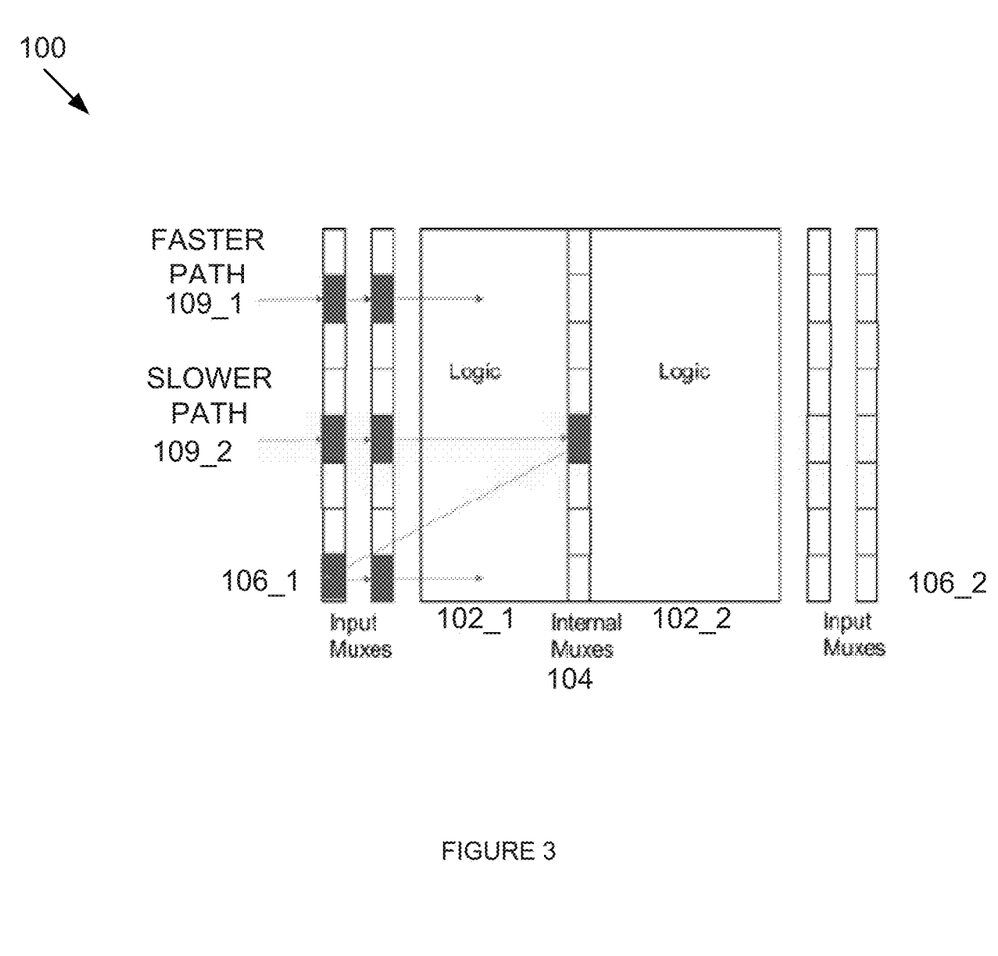
FIG. 3 depicts an example of the CLB internal routing where a faster path provides a dedicated point-to-point connection between one of the input muxes on the left of the CLBs to one of the input muxes on the right of the CLBs without utilizing the internal bnodes in the middle of the CLBs, according to some examples.

In some embodiments, the CLB internal routing architecture 100 is configured to include and enable both faster connections between the input muxes 106s on the left and right of the CLBs 102 that bypasses the bnodes 104s and slower connections that utilizes the bnodes 104s to reach an input mux 106 on one side of the CLBs 102 wherein the input mux 106 may otherwise be unreachable. FIG. 3 depicts an example of the CLB internal routing architecture 100 where a dedicated point-to-point connection between one of the input muxes 106_1 on the left of the CLBs 102s and one of the input muxes 106_1 on the left or 106_2 on the right of the CLBs 102s provides a faster path 109_1 between the input muxes without utilizing the internal bnodes 104s in the middle of the CLBs 102s. The CLB internal routing architecture 100 in FIG. 3 further provides a slower path 109_2 routed from 106_1 on the left of the CLBs 102s to one of the input muxes 106_2 on the right of the CLBs 102s by "bouncing through" the bnodes 104s on an extra layer of muxes. As such, the CLB internal routing architecture 100 in FIG. 3 enables both a limited number of fast point-to-point connections between the input mux 106_1 and 106_2 on the two sides of the CLBs 102s, and reachability of all input muxes 106_2 on the right of the CLBs 102 by routing through the bnodes 104_2 in the middle of the CLBs 102s.

Figure 4:
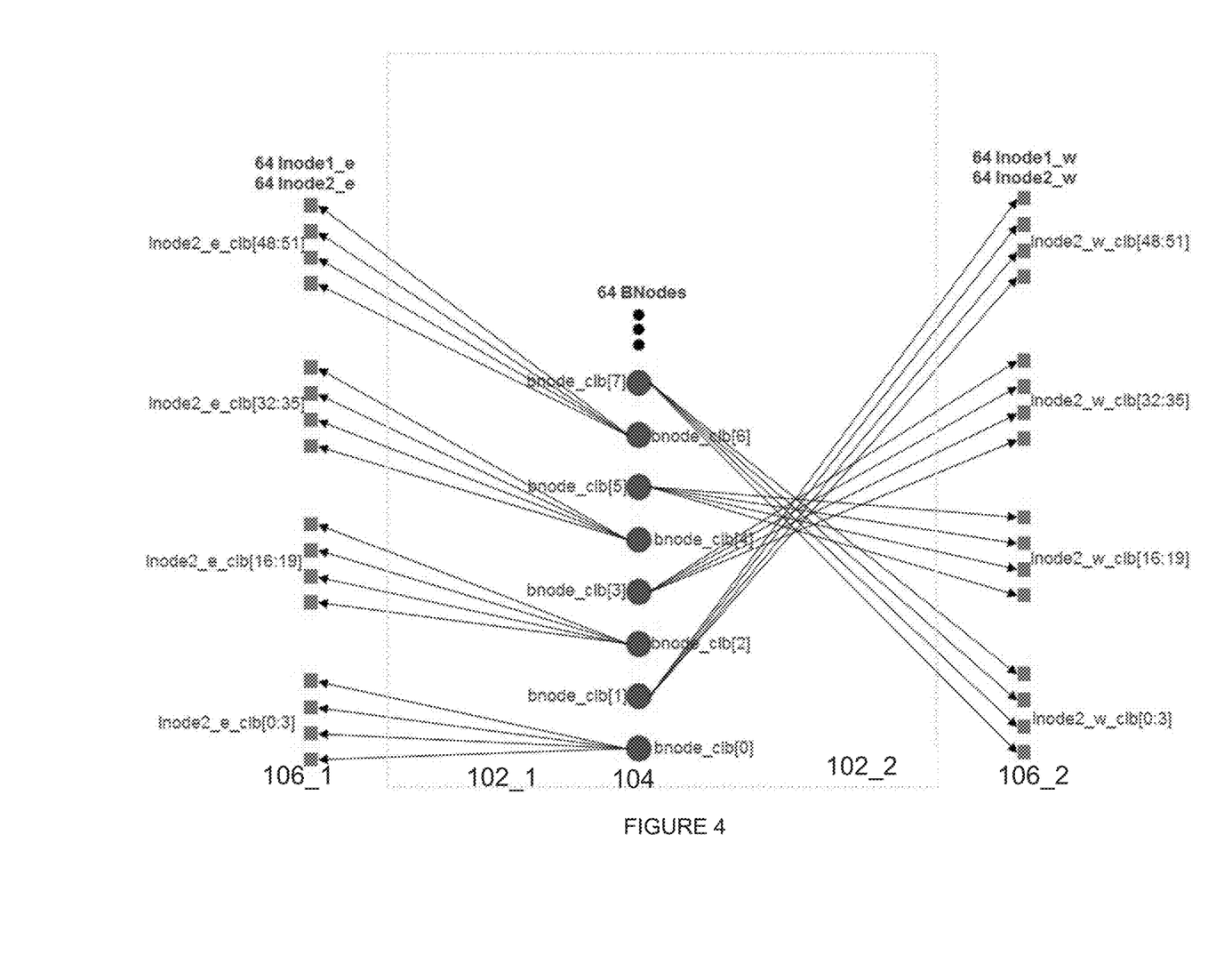
FIG. 4 depicts an example of the CLB internal routing/connectivity pattern from the inodes on the left of the CLBs to the inodes on the right of the CLBs through the set of bodes in the middle of the CLBs, according to some examples.
Figure 5:
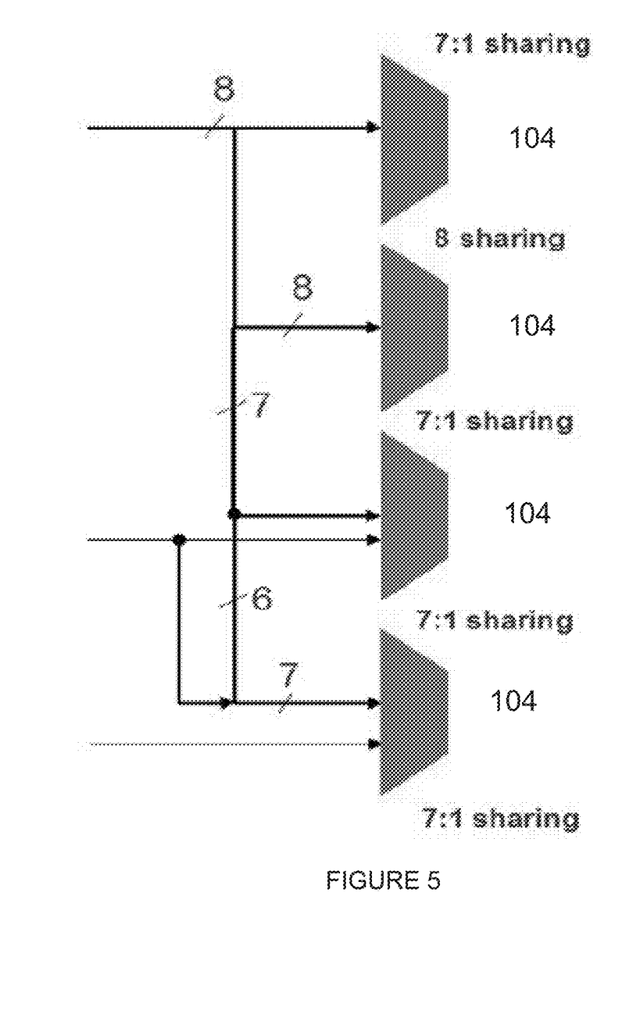
FIG. 5 depicts an example of a bnode, which includes four 8×1 muxes using 7:1 sharing among their inputs, according to some examples.

FIG. 4 depicts an example of the CLB internal routing/connectivity pattern from the inodes 106_1s on the left of the CLBs to the inodes 106_2s on the right of the CLBs through the set of bodes 104s in the middle of the CLBs. As shown in the example of FIG. 4, there are 64 bnodes in the middle of CLBs which has two slices 102_1 and 102_2 on the left and right side, respectively. The 64 bnodes can be arranged into 16 sets of four bnodes, wherein two of the bnodes from each set connect to the inodes 106_1s on the left side of the CLBs 102s and two of the bnodes from the same set connect to the inodes 106_2s on the right side of the CLBs 102s. Two four-bnode sets are configured to connect to all quadrants of the CLB. FIG. 5 depicts an example of a bnode 104, which includes four 8×1 muxes using 7:1 sharing among their inputs. For a non-limiting example, inputs to one mux may include 4 bypasses, 3 outputs, and 1 single sharing pin.

In some embodiments, the set of bnodes 104s is configured to serve as a crossbar between the inputs and/or outputs to the inodes 106_1s and 106_2s on different sides of the CLBs, respectively, by routing signals between the inodes 106_1s and 106_2s without requiring direct point-to-point connections between the inodes 106_1s and 106_2s that may increase the complexity of a crossbar quadratically when the number of the inodes increases. In some embodiments, the set of bnodes 104s are configured to enable signals from inodes 106s on the left and/or the right of the CLBs to go to the bnodes 104s in the middle of the CLBs first and then go from the set of bnodes 104s in the middle of the CLBs to inodes 106s on either the left or right of the CLBs. Such connectivity pattern increases the probability of making local connections within the CLBs on a lower layer without exiting into general interconnect routing at a higher layer. Additionally, the connectivity pattern enables signals from general interconnect to utilize the first inode hit to find a path to a pin/second inode on the opposite side via the bnodes 104s without back tracking to the general interconnect routing. With the reduction in general interconnect in architectures caused by new processes, completing as many internal CLB connections internally becomes more valuable. In addition, since FPGA style interconnect is not designed to route out and back quickly, close connections made locally avoid routing interconnect wires out in a circle and looping back, which often leads to high delay and wiring cost.

Figure 6:
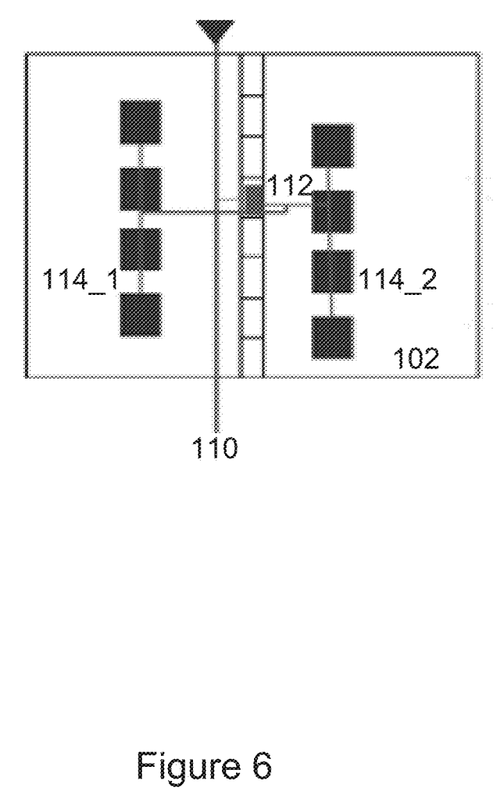
FIG. 6 depicts an example of the CLB internal routing architecture wherein a clock spine and a set of cnodes are moved and embedded in the center of the CLB, according to some examples.

In some embodiments, the CLB internal routing architecture 100 is configured to move and embed a clock spine 110 of interconnect wires and a set of control muxes/cnodes 112s, which are configured to provide clock signals to a plurality of flip flops of the plurality of configurable logic elements 114s in the CLB 102, from one side/edge of the CLB 102 to the center of the CLB 102 as shown by the example depicted in FIG. 6. As a result, the configurable logic elements 114s in the CLB 102 are located on the left side and right side of the clock spine 110 and the cnodes 112s and are all connected to the plurality of cnodes 112s in the center of the CLB. The primary function of the clock spine 110 is to provide clock signals to the control muxes/cnodes 112s, which are connected to the configurable logic elements 114s on the left and right and drive control pins of the flip flops of the configurable logic elements 114s with the clock signals from the clock spine 110. Having the clock spine 110 and the cnodes 112s moved to the center of the CLB 102 reduces the distance/wire length from the clock spine 110 and the cnodes 112s to the logic elements 114s in the CLB 102, thereby reducing the horizontal track usage in interconnect needed to provide the clock signals to the logic elements 114s. Since the configurable logic elements 114s in the CLB 102 located on the left and right side of the clock spine 110 and the cnodes 112s have closer and shorter distances to the clock spine 110 and the cnodes 112s, the disparities in distances from the clock spine 110 placed in the center of the CLB 102 to the logic elements 114s on the left and right side of the clock spine 110 are narrower than a clock spine 110 placed on one side of the CLB 102. As a result, clock skews among the clock signals to the logic elements 114s is reduced. In addition, due to the closer connectivity from the clock spine 110 to control the logic elements 114s, clock power consumption is also reduced.

In some embodiments, one or more of the cnodes 112s embedded in the center of the CLB 102 are also configured to be used as additional bounce nodes to offload localized internal routing within the CLB 102 as discussed above when the cnodes 112s are not used for driving the clock signals to the logic elements 114s. Specifically, each of the one or more cnodes 112 is configured to establish a first routing connection between the cnode 112 and one of the configurable logic elements 114_1 on the left of the cnode 112 as well as a second routing connection between the cnode 112 and one of the configurable logic elements 114_2 on the right of the cnode 112, wherein both the first and second routing connections are localized within the CLB 102. In some embodiments, the cnodes 112s embedded in the center of the CLB 102 are configured to serve as a crossbar for inbound signals into the CLB 102 as well as internal feedback signals within the CLB 102. In some embodiments, the cnodes 112s are used as an optional routing path to input pins of the CLB 102, which does not result in increasing delay to the input pins as the routing path is optional.

Figure 7:
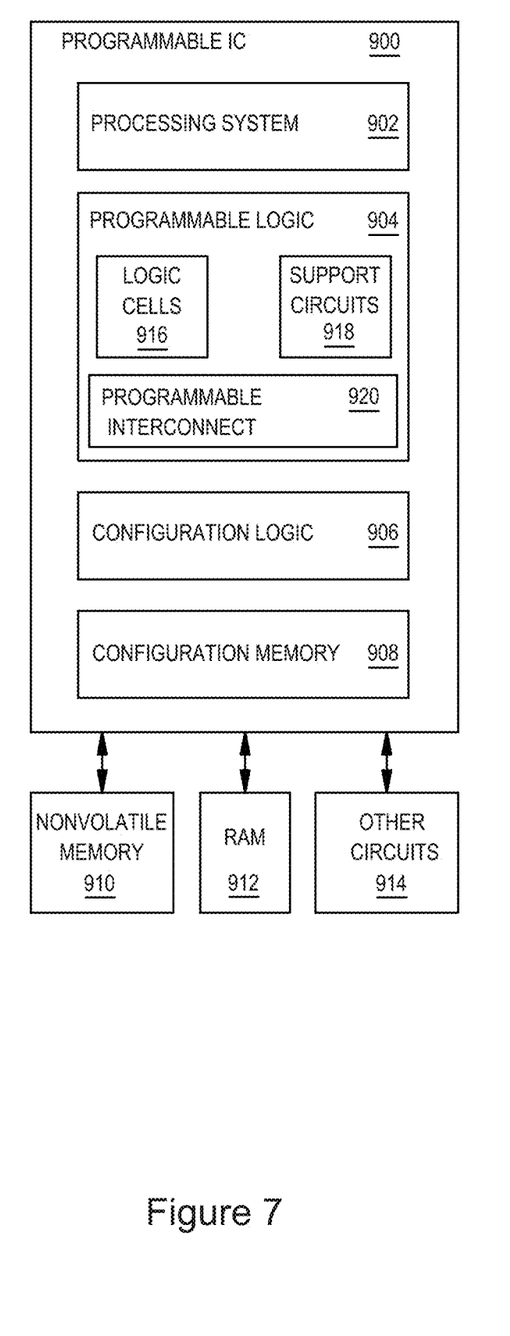
FIG. 7 is a block diagram depicting a programmable integrated circuit (IC), according to some examples.

FIG. 7 is a block diagram depicting a programmable integrated circuit (IC) 900 according to an example. The programmable IC 900 can implement the integrated circuit (IC) chip of systems of FIGS. 1-6, in whole or in part. The programmable IC 900 includes a processing system 902, programmable logic 904, configuration logic 906, and configuration memory 908. The programmable IC 900 can be coupled to external circuits, such as nonvolatile memory 910, RAM 912, and other circuits 914.

The processing system 902 can include microprocessor(s), memory, support circuits, IO circuits, and the like. The programmable logic 904 includes logic cells 916, support circuits 918, and programmable interconnect 920. The logic cells 916 include circuits that can be configured to implement general logic functions of a plurality of inputs. The support circuits 918 include dedicated circuits, such as transceivers, input/output blocks, digital signal processors, memories, and the like. The logic cells and the support circuits 918 can be interconnected using the programmable interconnect 920. Information for programming the logic cells 916, for setting parameters of the support circuits 918, and for programming the programmable interconnect 920 is stored in the configuration memory 908 by the configuration logic 906. The configuration logic 906 can obtain the configuration data from the nonvolatile memory 910 or any other source (e.g., the RAM 912 or from the other circuits 914).

Figure 8:
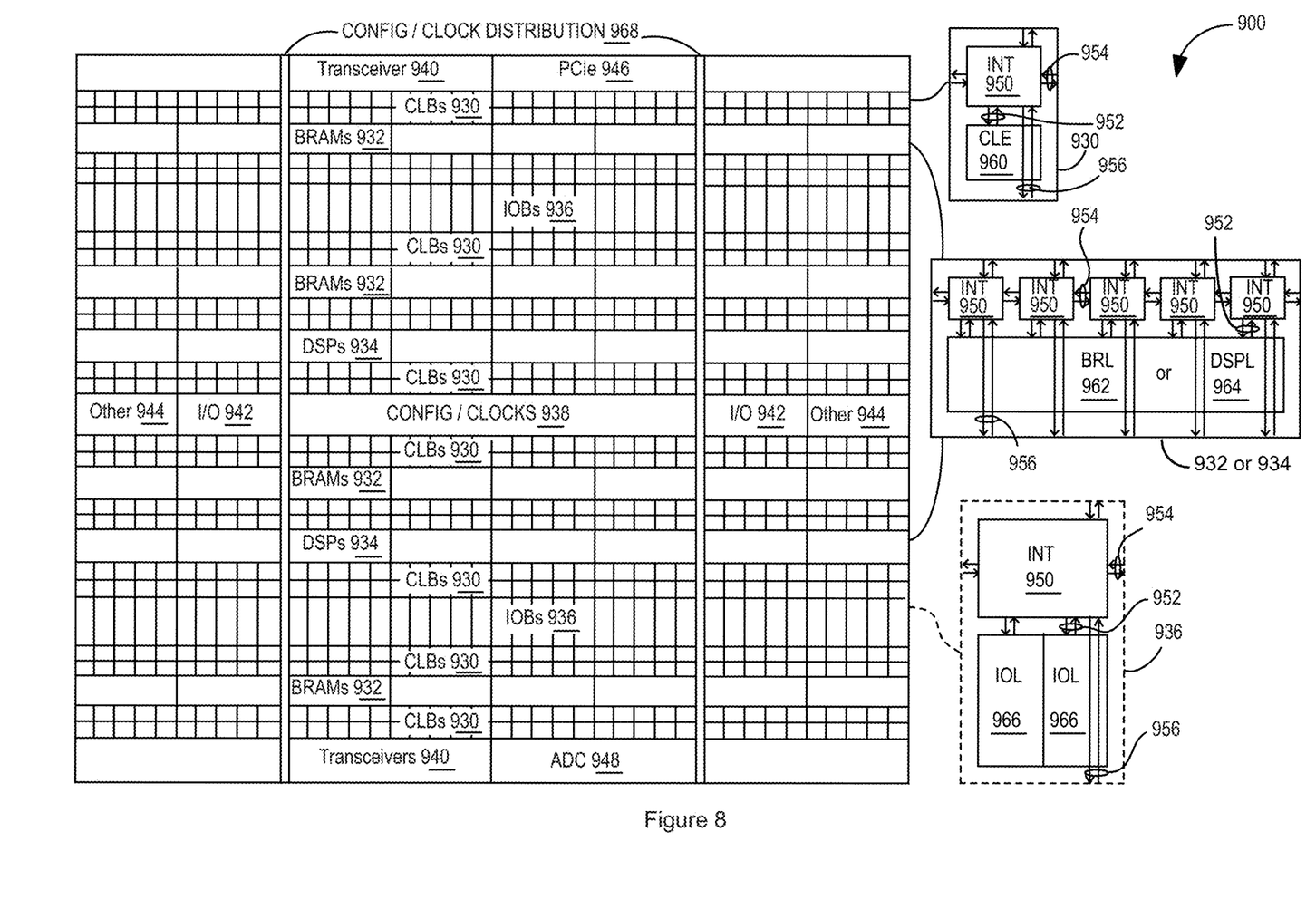
FIG. 8 is a field programmable gate array (FPGA) implementation of the programmable IC, according to some examples.

FIG. 8 illustrates an FPGA implementation of the programmable IC 900 that includes a large number of different programmable tiles including configurable logic blocks ("CLBs") 930, random access memory blocks ("BRAMs") 932, signal processing blocks ("DSPs") 934, input/output blocks ("IOBs") 936, configuration and clocking logic ("CONFIG/CLOCKS") 938, digital transceivers 940, specialized input/output blocks ("I/O") 942 (e.g., configuration ports and clock ports), and other programmable logic 944 such as digital clock managers, system monitoring logic, and so forth. The FPGA can also include PCIe interfaces 946, analog-to-digital converters (ADC) 948, and the like.

In some FPGAs, each programmable tile can include at least one programmable interconnect element ("INT") 950 having connections to input and output terminals 952 of a programmable logic element within the same tile, as shown by examples included in FIG. 8. Each programmable interconnect element 950 can also include connections to interconnect segments 954 of adjacent programmable interconnect element(s) in the same tile or other tile(s). Each programmable interconnect element 950 can also include connections to interconnect segments 956 of general routing resources between logic blocks (not shown). The general routing resources can include routing channels between logic blocks (not shown) comprising tracks of interconnect segments (e.g., interconnect segments 956) and switch blocks (not shown) for connecting interconnect segments. The interconnect segments of the general routing resources (e.g., interconnect segments 956) can span one or more logic blocks. The programmable interconnect elements 950 taken together with the general routing resources implement a programmable interconnect structure ("programmable interconnect") for the illustrated FPGA.

In an example implementation, a CLB 930 can include a configurable logic element ("CLE") 960 that can be programmed to implement user logic plus a single programmable interconnect element ("INT") 950. A BRAM 932 can include a BRAM logic element ("BRL") 962 in addition to one or more programmable interconnect elements. Typically, the number of interconnect elements included in a tile depends on the height of the tile. In the pictured example, a BRAM tile has the same height as five CLBs, but other numbers (e.g., four) can also be used. A signal processing block 934 can include a DSP logic element ("DSPL") 964 in addition to an appropriate number of programmable interconnect elements. An IOB 936 can include, for example, two instances of an input/output logic element ("IOL") 966 in addition to one instance of the programmable interconnect element 950. As will be clear to those of skill in the art, the actual I/O pads connected, for example, to the input/output logic element 966 typically are not confined to the area of the input/output logic element 966.

In the pictured example, a horizontal area near the center of the die is used for configuration, clock, and other control logic. Vertical columns 968 extending from this horizontal area or column are used to distribute the clocks and configuration signals across the breadth of the FPGA.

Some FPGAs utilizing the architecture illustrated in FIG. 8 include additional logic blocks that disrupt the regular columnar structure making up a large part of the FPGA. The additional logic blocks can be programmable blocks and/or dedicated logic.

Note that FIG. 8 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 8 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A system comprising:
  a pair of configurable logic blocks (CLBs) each comprising a plurality of configurable logic elements placed adjacent to each other;
  a first and a second set of interconnect nodes (inodes) configured to accept input and/or output signals to and/or from the pair of CLBs, wherein the first set of inodes is positioned to the left of the pair of adjacent CLBs and the second set of inodes is positioned to the right of the pair of adjacent CLBs; and
  a plurality of bounce nodes (bnodes) embedded in the center between the pair of adjacent CLBs, wherein each bnode of the plurality of bnodes is configured to
    establish a first routing connection between the bnode and one of the first set of inodes on the left of the pair of adjacent CLBs, and
    establish a second routing connection between the bnode and one of the second set of inodes on the right of the pair of adjacent CLBs,
  wherein both the first and second routing connections are localized within the pair of adjacent CLBs.

2. The system of claim 1, wherein each bnode of the plurality of bnodes and each inode of the first and the second sets of inodes includes one or more multiplexers.

3. The system of claim 2, wherein at least a set of the plurality of bnodes share multiple inputs to their one or more multiplexers.

4. The system of claim 1, wherein the plurality of bnodes is driven by one or more of local outputs, horizontal routing resources, bypass pins, and inodes of the CLBs.

5. The system of claim 1, wherein the plurality of bnodes is configured to
  route an input from one of the first set of the plurality of sets of inodes to one bnode of the plurality of bnodes, and
  route the input from the one bnode of the plurality of bnodes to reach all of the second set of the plurality of sets of inodes the input is intended to reach without requiring any direct point-to-point connection between an inode of the first set of inodes and an inode of the second set of inodes.

6. The system of claim 1 further comprising:
  one or more dedicated point-to-point connections between one inode of the first set of inodes on the left of the CLBs and another inode of the first set of inodes on the left or the second set of inodes on the right of the CLBs without utilizing the plurality of bnodes in the middle of the adjacent CLBs for fast connection between the one inode and the other inode on the two sides of the adjacent CLBs.

7. The system of claim 1, wherein the plurality of bnodes are arranged into multiple sets, wherein each set comprises four bnodes, wherein two bnodes in each set are configured to connect to the first set of inodes on the left side of the adjacent CLBs and two bnodes in the set are configured to connect to the second set of inodes on the right side of the adjacent CLBs.

8. The system of claim 1, wherein the plurality of bnodes is configured to serve as a crossbar between the inputs and/or outputs to the first set of inodes and the second set of inodes on different sides of the adjacent CLBs, respectively.

9. The system of claim 8, wherein the plurality of bnodes is configured to
route a signal from one of the first set of inodes on the left the adjacent CLBs to go to one bnode of the plurality of bnodes in the middle of the CLBs, and
route the signal from the one bnode in the middle of the CLBs to one or more inodes either in the first set of inodes on the left or in the second set of inodes on right of the CLBs.

10. A system comprising:
a configurable logic block (CLB) comprising a plurality of configurable logic elements;
a clock spine of interconnect wires configured to provide one or more clock signals to the plurality of configurable logic elements via a plurality of control nodes (cnodes); and
said plurality of cnodes connected to the plurality of configurable logic elements and configured to drive control pins of the configurable logic elements with the one or more clock signals from the clock spine,
wherein the clock spine and said plurality of cnodes are embedded in the center of the CLB, wherein the plurality of configurable logic elements in the CLB are positioned on the left side and right side of the clock spine and are all connected to the plurality of cnodes in the center of the CLB.

11. The system of claim 10, wherein each cnode of the plurality of cnodes includes one or more multiplexers.

12. The system of claim 10, wherein one or more cnodes of the plurality of cnodes embedded in the center of the CLB are configured to be used as bounce nodes (bnodes) to offload localized internal routing within the CLB when the one or more cnodes are not used for driving the one or more clock signals to the plurality of configurable logic elements of the CLB.

13. The system of claim 12, wherein each cnode of the one or more cnodes is configured to
establish a first routing connection between the cnode and one configurable logic element of the plurality of configurable logic elements on the left of the cnode,
establish a second routing connection between the cnode and one configurable logic element of the plurality of configurable logic elements on the right of the cnode,
wherein both the first and second routing connections are localized within the CLB.

14. The system of claim 10, wherein the plurality of cnodes embedded in the center of the CLB is configured as a crossbar for inbound signals into the CLB as well as internal feedback signals within the CLB.

15. The system of claim 10, wherein the plurality of cnodes routes signals from input pins of the CLB without resulting in increasing delay to the input pins.

16. A method comprising:
placing a pair of configurable logic blocks (CLBs) each comprising a plurality of configurable logic elements adjacent to each other;
positioning a first set of interconnect nodes (inodes) to the left of the pair of adjacent CLBs and a second set of inodes to the right of the pair of adjacent CLBs, wherein the first and the second sets of inodes are configured to accept input and/or output signals to and/or from the plurality of CLBs; and
embedding a plurality of bounce nodes (bnodes) in the center between the pair of adjacent CLBs, wherein each bnode of the plurality of bnodes is configured to
establish a first routing connection between the bnode and one inode of the first set of inodes on the left of the pair of adjacent CLBs;
establish a second routing connection between the bnode and one inode of the second set of inodes on the right of the pair of adjacent CLBs,
wherein the first and second routing connections are localized within the pair of adjacent CLBs.

17. The method of claim 16 further comprising:
routing an input from the one inode of the first set of inodes to one bnode of the plurality of bnodes; and
routing the input from the bnode to reach all of the second set of inodes the input is intended to reach without any direct point-to-point connection between the one inode of the first set of inodes and the second set of inodes.

18. The method of claim 16 further comprising:
establishing one or more dedicated point-to-point connections between one inode of the first set of inodes on the left of the CLBs and another inode of the first set of inodes on the left or an inode of the second set of inodes on the right of the CLBs without utilizing the plurality of bnodes in the middle of the adjacent CLBs for fast connection between the inodes on the two sides of the adjacent CLBs.

19. The method of claim 16 further comprising:
arranging the plurality of bnodes into multiple sets each having four bnodes, wherein two bnodes in each set are configured to connect to the first set of inodes on the left side of the adjacent CLBs and two bnodes in the set are configured to connect to the second set of inodes on the right side of the adjacent CLBs.

20. The method of claim 16 further comprising:
routing a signal from one inode of the first set of inodes on the left the adjacent CLBs to go to one bnode of the plurality of bnodes in the middle of the CLBs; and
routing the signal from the one bnode in the middle of the CLBs to one or more inodes either in the first set of inodes on the left or in the second set of inodes on right of the CLBs.

21. A method comprising:
embedding a clock spine of interconnect wires in a center of a configurable logic block (CLB) comprising a plurality of configurable logic elements, wherein the clock spine is configured to provide one or more clock signals to the plurality of configurable logic elements via a plurality of control nodes (cnodes);
embedding said plurality of cnodes in the center of the CLB, wherein the plurality of cnodes is connected to the plurality of configurable logic elements and configured to drive control pins of the plurality of configurable logic elements with the clock signals from the clock spine;
positioning the plurality of configurable logic elements in the CLB on the left side and right side of the clock spine and said plurality of cnodes; and
connecting the plurality of configurable logic elements to the plurality of cnodes in the center of the CLB.

* * * * *

UNITED STATES PATENT AND TRADEMARK OFFICE
CERTIFICATE OF CORRECTION

PATENT NO. : 10,715,149 B1
APPLICATION NO. : 16/513190
DATED : July 14, 2020
INVENTOR(S) : Eric F. Young et al.

Page 1 of 1

It is certified that error appears in the above-identified patent and that said Letters Patent is hereby corrected as shown below:

In the Claims

Column 9, Line 10, In Claim 9, after "left" insert -- of --.

Column 10, Line 41, In Claim 20, after "left" insert -- of --.

Signed and Sealed this
Eighteenth Day of May, 2021

Drew Hirshfeld
*Performing the Functions and Duties of the*
*Under Secretary of Commerce for Intellectual Property and*
*Director of the United States Patent and Trademark Office*